US008449994B2

(12) United States Patent
Tolpygo

(10) Patent No.: US 8,449,994 B2
(45) Date of Patent: May 28, 2013

(54) TURBINE ENGINE COMPONENTS

(75) Inventor: Vladimir K. Tolpygo, Scottsdale, AZ (US)

(73) Assignee: Honeywell International Inc., Morristown, NJ (US)

( * ) Notice: Subject to any disclaimer, the term of this patent is extended or adjusted under 35 U.S.C. 154(b) by 994 days.

(21) Appl. No.: 12/495,208

(22) Filed: Jun. 30, 2009

(65) Prior Publication Data
US 2010/0327213 A1 Dec. 30, 2010

(51) Int. Cl.
| F03D 11/02 | (2006.01) |
| F04D 29/38 | (2006.01) |
| B64C 11/16 | (2006.01) |
| F01D 5/14 | (2006.01) |
| B32B 27/32 | (2006.01) |
| B32B 9/00 | (2006.01) |
| B32B 15/04 | (2006.01) |
| B32B 19/00 | (2006.01) |

(52) U.S. Cl.
USPC ........... 428/702; 428/220; 428/469; 428/472; 428/697; 428/701; 416/241 B; 416/241 R

(58) Field of Classification Search
USPC ................. 428/701, 702, 220, 469, 472, 697; 416/241 B, 241 R
See application file for complete search history.

(56) References Cited

U.S. PATENT DOCUMENTS

| 4,321,311 | A | 3/1982 | Strangman |
| 4,886,768 | A * | 12/1989 | Tien .............................. 501/104 |
| 5,512,382 | A | 4/1996 | Strangman |
| 5,514,482 | A | 5/1996 | Strangman |
| 5,683,825 | A | 11/1997 | Bruce et al. |
| 6,102,656 | A * | 8/2000 | Nissley et al. ............. 415/174.4 |
| 6,183,884 | B1 | 2/2001 | Rickerby |
| 6,284,323 | B1 | 9/2001 | Maloney |
| 6,399,154 | B1 | 6/2002 | Williams et al. |
| 6,482,537 | B1 | 11/2002 | Strangman et al. |
| 6,492,038 | B1 | 12/2002 | Rigney et al. |

(Continued)

FOREIGN PATENT DOCUMENTS

| EP | 1249515 A2 | 10/2002 |
| EP | 1249515 A3 | 11/2003 |

(Continued)

OTHER PUBLICATIONS

Kim et al., "Phase Stability and Physical Properties of Cubic and Tetragonal $ZrO_2$ in the system $ZrO_2-Y_2O_3-Ta_2O_5$", Journal of the American Ceramic Society, vol. 74, No. 12, 1991, pp. 3061-3065.*

(Continued)

Primary Examiner — Jonathan Langman
(74) Attorney, Agent, or Firm — Ingrassia Fisher & Lorenz, P.C.

(57) ABSTRACT

A thermal barrier coating is formed over the substrate. A majority of the thermal barrier coating comprises a multi-phase material comprising a polycrystalline material including two or more phases. Each phase forms an individual grain, adjacent individual grains are separated by grain boundaries, each phase comprises an oxide compound, the multi-phase material is formed from three or more constituents, the three or more constituents consist of different materials that are not completely soluble in each other, and the two or more phases are not completely soluble in each other and do not form only one compound.

5 Claims, 3 Drawing Sheets

U.S. PATENT DOCUMENTS

| | | | |
|---|---|---|---|
| 6,677,064 B1 | 1/2004 | Subramanian | |
| 6,982,126 B2 | 1/2006 | Darolia et al. | |
| 7,041,383 B2 | 5/2006 | Liu et al. | |
| 7,060,365 B2 * | 6/2006 | Bruce | 428/632 |
| 7,074,506 B2 | 7/2006 | Chaput et al. | |
| 7,150,926 B2 | 12/2006 | Strangman | |
| 7,223,067 B2 | 5/2007 | Wilson et al. | |
| 7,374,821 B2 * | 5/2008 | Leclercq et al. | 428/469 |
| 2003/0148148 A1 | 8/2003 | Dietrich et al. | |
| 2004/0106015 A1 | 6/2004 | Damani et al. | |
| 2004/0191544 A1 | 9/2004 | Bast et al. | |
| 2004/0247922 A1 | 12/2004 | Chaput et al. | |
| 2006/0046090 A1 | 3/2006 | Spitsberg et al. | |
| 2006/0093851 A1 | 5/2006 | Darolia et al. | |
| 2006/0100086 A1 | 5/2006 | Mechnich | |
| 2007/0160859 A1 | 7/2007 | Darolia et al. | |
| 2009/0110953 A1 * | 4/2009 | Margolies | 428/621 |
| 2009/0148694 A1 | 6/2009 | Kaiser et al. | |

FOREIGN PATENT DOCUMENTS

| | | |
|---|---|---|
| EP | 1806432 A1 | 7/2007 |
| WO | 0118277 A1 | 3/2001 |
| WO | 2005112603 A2 | 12/2005 |
| WO | 2005112603 A3 | 12/2005 |

OTHER PUBLICATIONS

Pitek et al., "Oppurtunities for TBC's in the ZrO2-YO1.5-TaO2.5 system", Surface and Coatings Technology, vol. 201, 2007, pp. 6044-6050.*

EP Search Report, EP 10167095.8-2111/2269966 dated Mar. 27, 2012.

EP Communication, EP 10167095.8-2111 dated Apr. 23, 2012.

* cited by examiner

TURBINE ENGINE COMPONENTS

TECHNICAL FIELD

The inventive subject matter generally relates to turbine engine components, and more particularly relates to thermal barrier coatings for turbine engine components.

BACKGROUND

Turbine engines are used as the primary power source for various kinds of aircraft. Turbine engines may also serve as auxiliary power sources that drive air compressors, hydraulic pumps, and industrial electrical power generators. Most turbine engines generally follow the same basic power generation procedure. Specifically, compressed air is mixed with fuel and burned, and the expanding hot combustion gases are directed against stationary turbine vanes in the engine. The stationary turbine vanes turn the high velocity gas flow partially sideways to impinge onto turbine blades mounted on a rotatable turbine disk. The force of the impinging gas causes the turbine disk to spin at a high speed. Some turbine engines, such as jet propulsion engines, use the power created by the rotating turbine disk to draw more air into the engine, and the high velocity combustion gas is passed out of the turbine engine to create a forward thrust. Other engines use this power to turn one or more propellers, electrical generators, or other devices.

Because fuel efficiency improves as engine operating temperatures increase, turbine components such as engine blades and vanes are typically exposed to increasingly hotter gas temperatures. However, the ability to operate at these extreme temperatures is limited by the mechanical strength of the materials from which the turbine components are manufactured, as they may undesirably oxidize and/or corrode when exposed to the combustion gases.

To improve oxidation and/or corrosion resistance and decrease surface temperature of the turbine components, a protective thermal barrier coating (TBC) may be applied on the component. For example, ceramic thermal barrier coatings (TBCs) are used on turbine components to increase temperature capability and efficiency of gas turbines. One ceramic TBC consists of a layer of 7-8 weight percent yttria-stabilized zirconia (7YSZ) deposited by an electron beam physical vapor deposition (EB-PVD) process or by plasma spray onto a metallic bond coat formed over the turbine component. Although 7YSZ is suitable for use as a TBC for certain engine operating temperature ranges, it may not be suitable for use in higher temperature ranges. In such case, other more advanced ceramic TBCs, such as those that consist of lanthanide-base oxides with the general formula $A_2B_2O_7$, including but not limited to gadolinium zirconate, $Gd_2Zr_2O_7$ or neodymium zirconate, $Nd_2Zr_2O_7$, may be employed. Another example is fully-stabilized cubic zirconia, such as 20 weight percent yttria-stabilized zirconia (20YSZ). These more advanced ceramic TBCs have lower thermal conductivity and, therefore, may provide better thermal insulation as compared to 7YSZ. However, these oxides have significantly lower fracture toughness than 7YSZ, which limits TBC cyclic life and erosion resistance.

Accordingly, there is a need for an improved TBC that has both high fracture toughness and a reduced thermal conductivity, as compared to the aforementioned conventional TBCs. Additionally, it is desirable for the improved TBC to also be capable of exhibiting corrosion resistance, sintering resistance, and/or high temperature stability when subjected to the combustion gases of the turbine component. Furthermore, other desirable features and characteristics of the inventive subject matter will become apparent from the subsequent detailed description of the inventive subject matter and the appended claims, taken in conjunction with the accompanying drawings and this background of the inventive subject matter.

BRIEF SUMMARY

Turbine engine components are provided.

In an embodiment, by way of example only, the turbine engine component includes a substrate and a thermal barrier coating formed over the substrate. A majority of the thermal barrier coating comprises a multi-phase material comprising a polycrystalline material including two or more phases. Each phase forms an individual grain, adjacent individual grains are separated by grain boundaries, each phase comprises an oxide compound, the multi-phase material is formed from three or more constituents, the three or more constituents consist of different materials that are not completely soluble in each other, and the two or more phases are not completely soluble in each other and do not form only one compound.

In another embodiment, a turbine engine component includes a substrate and a thermal barrier coating formed over the substrate, where a majority of the thermal barrier coating comprises a multi-phase material, and the multi-phase material comprises a polycrystalline material including two or more phases. Each phase forms an individual grain, adjacent individual grains are separated by grain boundaries, each phase comprises an oxide compound or a solid solution, the phases are not completely soluble in each other and do not form only one compound the multi-phase material is formed from three or more constituents, and the three or more constituents are selected from a group consisting of a first combination comprising $ZrO_2$, $YO_{1.5}$, and $TaO_{2.5}$, a second combination comprising $ZrO_2$, $YO_{1.5}$, and $TiO_2$, a third combination comprising $ZrO_2$, $YO_{1.5}$, and $AlO_{1.5}$, and a fourth combination comprising $ZrO_2$, $YO_{1.5}$, and $NbO_{2.5}$.

BRIEF DESCRIPTION OF THE DRAWINGS

The inventive subject matter will hereinafter be described in conjunction with the following drawing figures, wherein like numerals denote like elements.

DETAILED DESCRIPTION

The following detailed description is merely exemplary in nature and is not intended to limit the inventive subject matter or the application and uses of the inventive subject matter. Furthermore, there is no intention to be bound by any theory presented in the preceding background or the following detailed description.

A thermal barrier coating for use on a turbine engine component is provided that may have improved elevated-temperature properties as compared to conventional thermal barrier coatings. In an embodiment, the thermal barrier coating is formed from material having a particular chemical composition and structure. The chemistry and structure may provide improved properties to the thermal barrier coatings related to thermal insulation, fracture toughness, corrosion resistance, and/or erosion resistance over those of conventional thermal barrier coatings, when the material is exposed to extreme engine operating temperatures (e.g., temperatures greater than about 2000° F. (1093° C.)). In another embodiment, the particular chemistry and structure of the material comprising the thermal barrier coating may have improved phase stability over a temperature range within which an engine operates.

Figure 1:
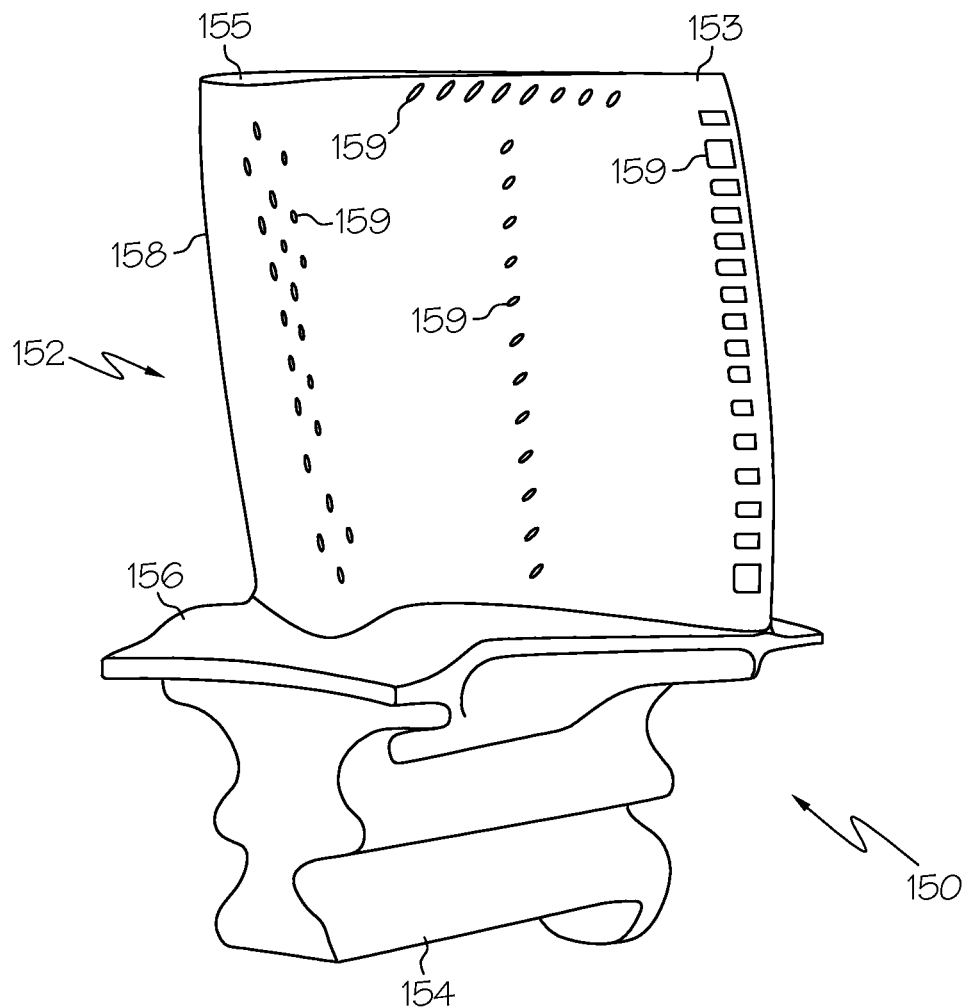
FIG. 1 is a perspective view of a turbine engine component 150, according to an embodiment.

FIG. 1 illustrates a turbine engine component 150, according to an embodiment. Here, the turbine engine component 150 is shown as turbine blade. However, in other embodiments, the turbine engine component 150 may be a turbine vane or other component that may be implemented in a gas turbine engine, or other high-temperature system. In an embodiment, the turbine engine component 150 includes an airfoil 152 including a pressure side surface 153, an attachment portion 154, a leading edge 158 including a blade tip 155, and a platform 156. In accordance with an embodiment, the component 150 may be formed with a non-illustrated outer shroud attached to the tip 155. The turbine engine component 150 may have non-illustrated internal air-cooling passages that remove heat from the turbine airfoil. After the internal air has absorbed heat from the superalloy blade, the air is discharged into a combustion gas flow path through passages 159 in the airfoil wall. Although the turbine engine component 150 is illustrated as including certain parts and having a particular shape and dimension, different shapes, dimensions and sizes may be alternatively employed depending on particular gas turbine engine models and particular applications.

Figure 2:
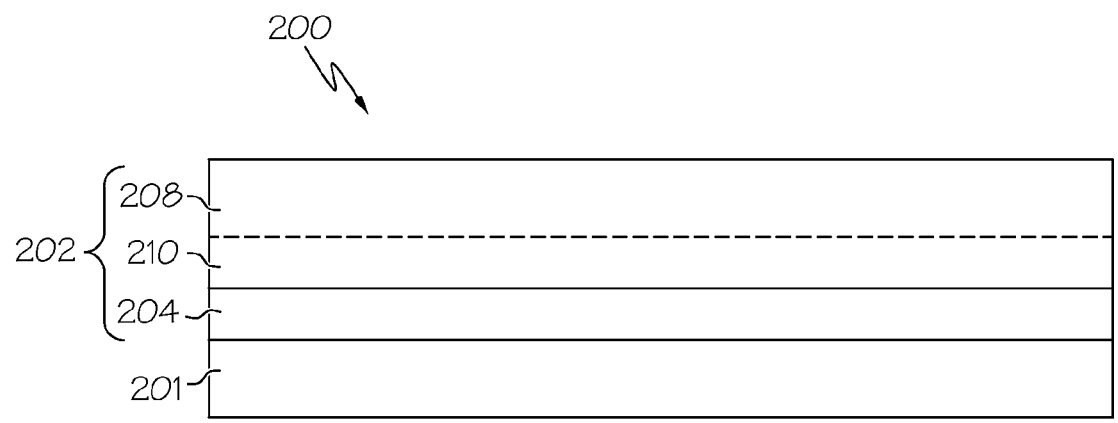
FIG. 2 is a simplified cross-sectional of a turbine engine component, according to an embodiment.

FIG. 2 is a cross-sectional view of a portion of a component 200, according to an embodiment. The component 200 may be, for example, a turbine airfoil such as the turbine blade shown in FIG. 1 and may include a protective coating system 202 disposed over a substrate 201. In an embodiment, the protective coating system 202 may include a bond coating 204, a thermal barrier coating 208, and one or more intermediate layers therebetween, such as a thermally grown oxide (TGO) 210.

The substrate 201 may be fabricated as a single crystal superalloy component from a single crystal superalloy material. A "single crystal superalloy material" may be defined as a superalloy material formed to have a single crystallographic orientation throughout its entirety and being substantially free (e.g., less than about 1%) of high angle boundaries. Suitable single crystal superalloy materials include, but are not limited to nickel-based superalloys, cobalt-based superalloys, and the like. The substrate 201 may alternatively be fabricated as a polycrystalline superalloy material.

The bond coating 204 is formed over the substrate 201 and bonds the thermal barrier coating 208 and/or another layer to the substrate 201. In an embodiment, the bond coating 204 may be a diffusion aluminide coating. In another embodiment, the bond coating 204 may be an overlay coating comprising MCrAlX, wherein M is an element selected from cobalt, nickel, or combinations thereof and X is an element selected from hafnium, zirconium, yttrium, tantalum, rhenium, ruthenium, palladium, platinum, silicon, or combinations thereof. The bond coating 204 may have a thickness in a range of from about 25 μm to about 150 μm, according to an embodiment. In other embodiments, the thickness of the bond coating 204 may be greater or less.

Figure 3:
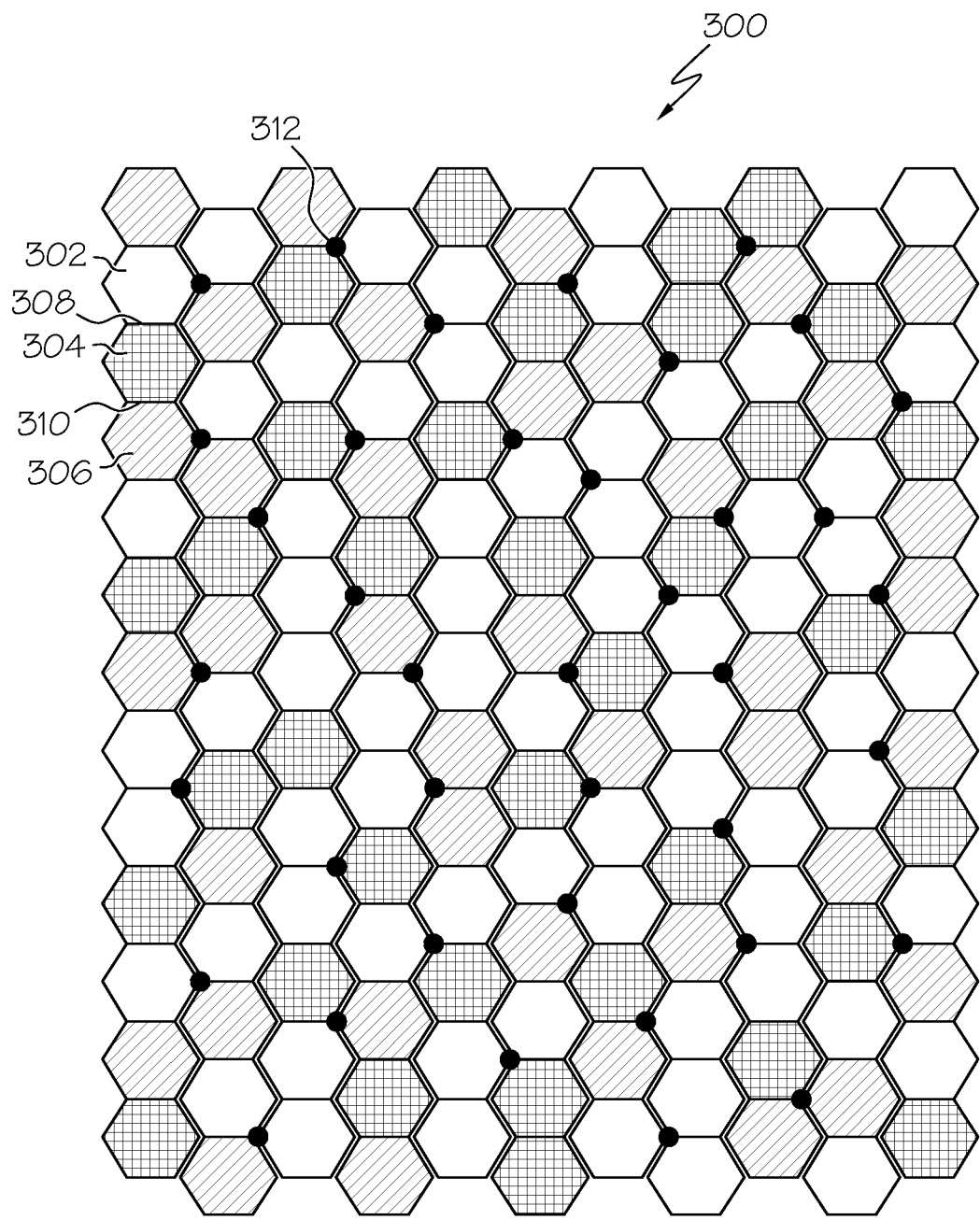
FIG. 3 is a close-up view of a portion of a thermal barrier coating of the turbine engine component in FIG. 1, according to an embodiment.

The thermal barrier coating 208 is formed over the substrate 201, and in an embodiment, may be formed over the bond coating 204. FIG. 3 is a close-up schematic view of a portion of a thermal barrier coating 300, according to an embodiment. In an embodiment, a majority of the thermal barrier coating 208 may be formed from a multi-phase material in order to provide improved properties of the thermal barrier coating 208 related to thermal insulation, fracture toughness, corrosion and/or erosion resistance over those of conventional thermal barrier coatings when the material is exposed to extreme engine operating temperatures. As used herein, the term "multi-phase material" may be defined as a polycrystalline material comprising three or more constituents that, when combined together and subjected to particular heat treatment processes, may form two or more phases. As used herein, the term "phase" may be defined as a region of a material that is chemically and structurally uniform and distinct, and thus, each phase forms an individual grain. According to an embodiment the two or more phases may comprise oxide phases, where each is a binary oxide or a more complex oxide compound or solid solution.

In an example, as depicted in FIG. 3, the thermal barrier coating 300 includes a plurality of individual grains 302, 304, 306, where the grains 302, 304, 306 are each a different phase, such as a different oxide phase. The different phases are randomly dispersed throughout the thermal barrier coating 300 to form a mixture. According to an embodiment, to provide improved mechanical and thermal insulation properties of the thermal barrier coating 300, the grains 302, 304, 306 are relatively small and may have average diameters in a range of about 0.01 micron to about 1 micron. Adjacent individual grains 302, 304, 306 are separated by grain boundaries, 308, 310 which also serve as inter-phase boundaries. The existence of the grain boundaries, 308, 310 may cause heat wave scattering to thereby reduce thermal conductivity of the thermal barrier coating 300.

Although three phases are included in the thermal barrier coating 300 of FIG. 3, the thermal barrier coating 300 may comprise two phases or more than three phases, in alternative embodiments. Each phase may comprise a material selected for an ability to exhibit a specific property, in an embodiment. For example, one phase may be selected for high fracture toughness, another phase may be selected for low thermal conductivity, and/or other phases (if included) may be selected for corrosion resistance, erosion resistance or the like. In another embodiment, each phase may have varying degrees of a certain desirable property. In accordance with an embodiment, the phases are selected such that they have limited solubility in each other and do not react with each other to form only one compound or a solid solution during deposition or during subsequent operation of the component. In this way, the thermal barrier coating 300 may retain structural stability and remain multi-phase. To provide the two or more aforementioned properties, the phases may comprise different oxide compounds. In an example, the oxide compounds may comprise either binary oxides or more complex oxides consisting of two or more metallic elements and oxygen.

Generally for a thermal barrier coating including three constituents, the three constituents may be represented by, $ZO_a$, $AO_b$ and $XO_c$, where Z, A and X are metallic elements, O is oxygen, a, b, and c are stoichiometric coefficients. In an embodiment, the three constituents are employed to form two or more oxide phases in the coating. A first oxide phase, referred to as Oxide 1, can be described by chemical formula $Z_mA_nX_pO$, where Z is zirconium, element A is a rare-earth metal, X is one metallic element from the group of Ta, Ti, Al, and Nb, and each stoichiometric coefficient, m, n, and p, can be any number that is equal or greater than zero (m, n, p≧0).

A second oxide phase, denoted as Oxide 2, can be described by chemical formula $Z_m A_n X_p O$, where at least one of the three coefficients (m, n, p) has a value that is different from the values of m, n, and p in Oxide 1. In an embodiment, the thermal barrier coating may contain a third oxide phase, denoted as Oxide 3. The third oxide phase can be described by chemical formula $Z_m A_n X_p O$, where at least one of the three coefficients (m, n, p) has a value that is different from the values employed for m, n, and p in Oxide 1 and Oxide 2. According to an embodiment, each oxide, Oxide 1, Oxide 2 and Oxide 3, may comprise an oxide compound (binary or more complex) or a solid solution. However, the oxides do not form a single common compound or a common solid solution at the service temperatures. In another embodiment, more complex chemical compositions can be achieved where element Z represents zirconium, hafnium, or a combination of the two, element A represents more than one rare-earth metal, and/or element X is more than one metallic element from the group of Ta, Ti, Al, and Nb. In this case, more than three oxide phases in the thermal barrier coating may be included.

Figure 4:
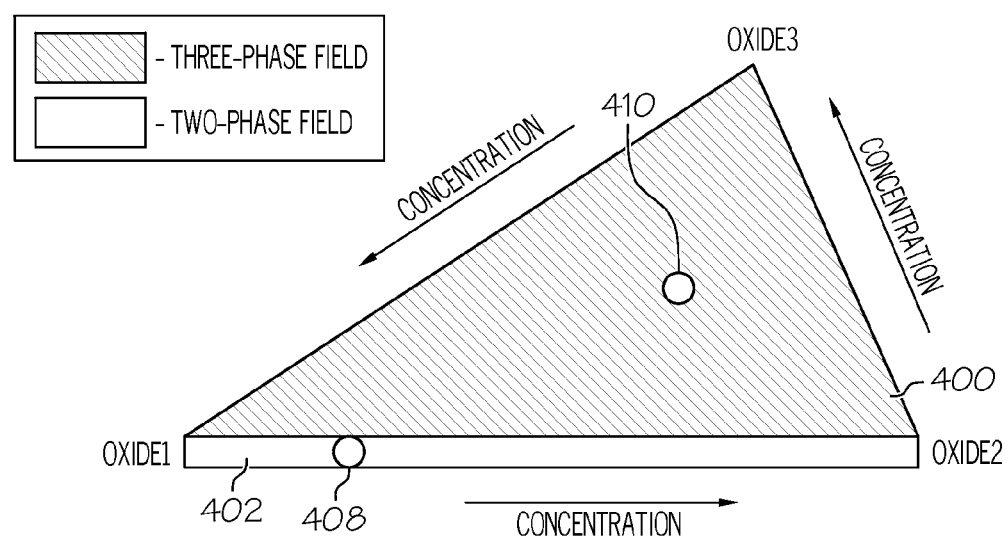
FIG. 4 is a portion of a hypothetical equilibrium phase diagram for a three-phase system, according to an embodiment.

FIG. 4 provides a graphic representation of the three-phase material in the form of a hypothetical equilibrium phase diagram representing various compositional combinations that may be suitable for employment as thermal barrier coating 300, according to an embodiment. The three-phase material includes three phases, which are each indicated as Oxide 1, Oxide 2, Oxide 3 and located at a corner of a triangle 400. The triangle 400 represents a three-phase compositional field. A polygon 402 having one common side with the triangle 400 represents a two-phase compositional field between Oxide 1 and Oxide 2. It will be appreciated that other two-phase fields may exist between other adjacent corners of the triangle 400. According to this diagram, two or three phases or oxide compounds may be formed in the thermal barrier coating.

By pinpointing a location within the triangle 400 or within the polygon 402, concentrations of each phase may be identified. For example, in an embodiment in which the thermal barrier coating includes two phases, a concentration of one phase in the thermal barrier coating relative to a concentration of another phase may be made by pinpointing a location 408 within the polygon 402. An average phase composition of the thermal barrier coating at the position 408 may be represented in mole percent by h % (Oxide 1)+k % (Oxide 2), where h and k are coefficients of the concentrations of the phases. Because position 408 is closer to Oxide 1 than to Oxide 2, coefficient h is greater than k. However, in other embodiments, other relative concentrations of the constituents may be employed.

In an embodiment in which the thermal barrier coating includes three phases, a concentration of each phase may be made by pinpointing a location within an interior of the triangle 400. An average phase composition of the thermal barrier coating at the pinpointed location 410 may be represented in mole percent by x % (Oxide1)+y % (Oxide2)+z % (Oxide3), where x, y, and z are coefficients of the concentrations of the phases. Because position 410 is farther from the corner "Oxide 1" than from the other two corners, x is smaller than y and z, and y may be substantially equal to z. In other embodiments, other relative concentrations of the phases alternatively may be employed.

A wide variety of constituents may be employed in the multi-phase materials. In an embodiment, the multi-phase material may comprise three constituents including $ZrO_2$, $AO_b$, and $XO_c$, and the oxide phases included in the thermal barrier coating may include A- and/or X-doped zirconia with one or more complex oxides having general formula $Zr_m A_n X_p O$, wherein A represents a metallic element, X represents another metallic element, O represents oxygen, and m, n, and p represent stoichiometric coefficients that are equal or greater than 0. In one particular embodiment, the multi-phase material may comprise three constituents including $ZrO_2$, $YO_{1.5}$, and $TaO_{2.5}$. According to an embodiment, two-phase material can be formed that consist essentially of a mixture of (Y+Ta)-doped tetragonal zirconia and yttrium tantalate $YTaO_4$, which may be formed from a composition including zirconia ($ZrO_2$) with equal amounts of >18 mol. % $YO_{1.5}$ and >18 mol. % $TaO_{2.5}$. In another embodiment in which two-phase material can be formed, the thermal barrier coating may include a mixture of (Y+Ta)-doped tetragonal zirconia and orthorhombic phase $Zr_6Ta_2O_{17}$, which may be formed from a composition including about 10 mol. % to about 12 mol. % $YO_{1.5}$, about 17 mol. % to about 19 mol. % $TaO_{2.5}$, and a balance of $ZrO_2$. In still another embodiment in which two-phase material can be formed, the thermal barrier coating may include a mixture of (Y+Ta)-doped tetragonal zirconia and (Y+Ta)-doped cubic zirconia, which may be formed from a composition including about 18 mol. % to about 20 mol. % $YO_{1.5}$, about 14 mol. % to about 16 mol. % $TaO_{2.5}$, and a balance of $ZrO_2$. In an embodiment in which three-phase material can be formed in the thermal barrier coating, the coating may consist essentially of a mixture of (Y+Ta)-doped tetragonal zirconia, yttrium tantalate $YTaO_4$, and orthorhombic phase $Zr_6Ta_2O_{17}$, which may be formed from a composition including about 10 mol. % to about 20 mol. % $YO_{1.5}$, about 20 mol. % to about 25 mol. % $TaO_{2.5}$, and a balance of $ZrO_2$. In another embodiment, the coating may consist essentially of a mixture of (Y+Ta)-doped tetragonal zirconia, (Y+Ta)-doped cubic zirconia, and yttrium tantalate $YTaO_4$, which may be formed from a composition of about 20 mol. % to about 30 mol. % $YO_{1.5}$, about 15 mol. % to about 20 mol. % $TaO_{2.5}$, and a balance of $ZrO_2$.

In another particular embodiment, the multi-phase material may comprise three constituents including $ZrO_2$, $YO_{1.5}$, and $TiO_2$. In such an embodiment, a two-phase thermal barrier coating may include a mixture of (Y+Ti)-doped tetragonal zirconia and pyrochlore phase $Y_2Ti_2O_7$, which may be formed from a composition including about 10 mol. % $YO_{1.5}$, about 25 mol. % $TiO_2$, and a balance of $ZrO_2$. In another embodiment in which three phrases are included in the thermal barrier coating, the coating may consist essentially of a mixture of (Y+Ti)-doped tetragonal zirconia, titanium zirconate $ZrTiO_4$, and pyrochlore phase $Y_2Ti_2O_7$, which may be formed from a composition including about 6 mol. % to about 10 mol. % $YO_{1.5}$, and 25 mol. % to about 35 mol. % $TiO_2$, and a balance of $ZrO_2$.

In still another embodiment, the multi-phase material may comprise three constituents including $ZrO_2$, $YO_{1.5}$, and $AlO_{1.5}$. For example, the thermal barrier coating may consist essentially of a mixture of two phases, yttria-doped cubic zirconia and yttria-alumina garnet $Y_3Al_5O_{12}$, which may be formed from a composition including about 25 mol. % to about 35 mol. % $YO_{1.5}$, about 10 mol. % to about 25 mol. % $AlO_{1.5}$, and a balance of $ZrO_2$. In an embodiment in which the thermal barrier coating consists of three phases, the phases may be yttria-doped cubic zirconia, aluminum oxide $AlO_{1.5}$, and yttria-alumina garnet $Y_3Al_5O_{12}$, which may be formed from a composition including about 15 mol. % to about 25 mol. % $YO_{1.5}$, about 20 mol. % to about 40 mol. % $AlO_{1.5}$, and a balance of $ZrO_2$. In still another embodiment, the multi-phase material may comprise three constituents including $ZrO_2$, $YO_{1.5}$, and $NbO_{2.5}$.

In still yet another embodiment, the multi-phase material may comprise three constituents including HfO, $AO_b$, and $XO_c$, and the phases included in the thermal barrier coating may consist essentially of A- and X-doped hafnia with one or more complex oxides having general formula $Hf_mA_nX_pO$, wherein A represents a metallic element that includes yttrium or other rare-earth metal, X represents another metallic element from the group of Ta, Ti, Al, and Nb, O represents oxygen, and m, n, and p represent stoichiometric coefficients that are equal or greater than zero.

Although many embodiments of mixtures suitable for forming the thermal barrier coating are provided above, other mixtures that are not listed and that include phases which exhibit desirable features may alternatively be included. In other embodiments, more than three constituents may be included in the thermal barrier coating. In such case, two or more phases may be formed from the more than three constituents.

In any case, returning to FIG. 3, a majority of the thermal barrier coating 300 is preferably comprised of the mixture of phases 302, 304, 306. Although concentrations of each of the phases are shown as being relatively even throughout the thermal barrier coating 300, a concentration of grains of one of the phases may be greater in one portion of the thermal barrier coating than the concentrations of grains of the other phases, in other embodiments. In particular, the multi-phase material may have a first volume fraction of a first oxide compound and a second volume fraction of the second oxide compound, and the first volume fraction and the second volume fraction is not uniform across a thickness of the thermal barrier coating. In another embodiment, the volume fractions may not be equal. In such case, the thermal barrier coating 300 may include more one of the phases and less of the other phase, where the former may be considered as a matrix in which a second or third phase is dispersed.

To improve thermal insulating and mechanical properties of the coating, the grains are relatively small. For example, each individual grain may have an average diameter within a range of about 0.01 microns to about 2 microns. In another embodiment, each individual grain may have an average diameter within a range of about 0.01 microns to about 0.1 micron. In still another embodiment, each individual grain may have an average diameter that is smaller or larger than the aforementioned ranges. In an embodiment, the thermal barrier coating 208 (FIG. 2) may have a thickness that may vary and may be, for example, in a range from about 50 μm to about 1000 μm. In other embodiments, the thickness of the thermal barrier coating 208 may be in a range of from about 100 μm to about 250 μm. In still other embodiments, the thermal barrier coating 208 may be thicker or thinner than the aforementioned ranges. In an embodiment, the thermal barrier coating may also include pores 312 that are formed in between two or more of the grains 302, 304, 306. The pores serve to additionally decrease thermal conductivity of the coating. For example, each individual pore 312 may have an average diameter within a range of about 0.01 microns to about 2 microns. In another embodiment, each individual pore 312 may have an average diameter within a range of about 0.01 microns to about 0.1 micron. In still another embodiment, each individual pore may have an average diameter that is smaller or larger than the aforementioned ranges. According to an embodiment, a volume fraction of the pores in the thermal barrier coating is in a range of about 0% to about 25%.

In accordance with an embodiment, the thermal barrier coating 300 may be produced using an electron beam-physical vapor deposition (EB-PVD) process using two or more evaporation sources (ingots). Each ingot may consist of a separate oxide that may be either a pure (binary) oxide or a complex oxide, which has been selected for use as a starting material comprising a selected constituent. During deposition, electron beam(s) continuously or sequentially evaporates different ingots. Condensation of the oxides on a substrate produces a thermal barrier coating comprising a variety of different oxides. These oxides may already form two or more separate phases during deposition. Alternatively, post-deposition heat treatment may be used to precipitate oxide phases according to the corresponding equilibrium (and/or metastable) phase diagram. The amount and the distribution of individual oxides throughout a thickness of the thermal barrier coating can be varied by selecting specific electron beam dwell time per ingot, distance between the ingot and the part, electron beam power density and scan pattern.

A thermal barrier coating has been provided that has both high fracture toughness and a reduced thermal conductivity, as compared to conventional thermal barrier coatings. The improved thermal barrier coating may be capable of exhibiting corrosion resistance, sintering resistance, and/or high temperature stability when subjected to the combustion gases of the turbine component. One of the benefits of the multi-phase coatings is that their average chemical composition may vary within the corresponding multi-phase field. This will change relative amounts of each phase, but not the constituent phases themselves. This is in contrast with the majority of single-phase coatings where the average composition should be maintained within a very narrow limits. A minor deviation from such fixed composition may drastically change properties of a single-phase coating. Another benefit of the multi-phase coatings is that the relative amounts of the constituent phases may be intentionally varied across the coating thickness. For example, the outer layer of the coating may have a higher proportion of the phase, which provides better erosion resistance, while the inner layer of the coating may have more of the phase having higher thermal expansion coefficient to reduce thermal stresses in the coating.

While at least one exemplary embodiment has been presented in the foregoing detailed description of the inventive subject matter, it should be appreciated that a vast number of variations exist. It should also be appreciated that the exemplary embodiment or exemplary embodiments are only examples, and are not intended to limit the scope, applicability, or configuration of the inventive subject matter in any way. Rather, the foregoing detailed description will provide those skilled in the art with a convenient road map for implementing an exemplary embodiment of the inventive subject matter. It being understood that various changes may be made in the function and arrangement of elements described in an exemplary embodiment without departing from the scope of the inventive subject matter as set forth in the appended claims.

What is claimed is:

1. A turbine engine component, comprising:
  a substrate; and
  a thermal barrier coating formed over the substrate, a majority of the thermal barrier coating comprising a multi-phase material, the multi-phase material comprising a polycrystalline material including two or more phases,
  wherein:
    each phase forms an individual grain,
    adjacent individual grains are separated by grain boundaries,
    each phase comprises an oxide compound,
    the multi-phase material is formed from three or more constituents,
    the three or more constituents consist of different materials that are not completely soluble in each other, the two or more phases are not completely soluble in each other and do not form only one compound, the three or more constituents comprise $ZrO_2$, $YO_{1.5}$, and $TaO_{2.5}$ and the two or more phases consist essentially of (Y+Ta)-doped tetragonal zirconia, yttrium tantalate $YTaO_4$, and orthorhombic phase $Zr_6Ta_2O_{17}$.

2. The turbine engine component of claim 1, wherein:

the multi-phase material has a first volume fraction of a first oxide phase and a second volume fraction of a second oxide phase, and the first volume fraction and the second volume fraction is not uniform across a thickness of the thermal barrier coating.

3. The turbine engine component of claim 1, wherein each individual grain has an average diameter within a range of about 0.01 microns to about 5 microns.

4. The turbine engine component of claim 1, wherein the multi-phase material includes pores and a volume fraction of the pores in the thermal barrier coating is in a range of about 0% to about 25%.

5. A turbine engine component, comprising:

a substrate; and a thermal barrier coating formed over the substrate, a majority of the thermal barrier coating comprising a multi-phase material, the multi-phase material comprising a polycrystalline material including two or more phases, wherein:

each phase of the two or more phases forms an individual grain, adjacent individual grains are separated by grain boundaries, each phase of the two or more phases comprises an oxide compound or a solid solution, the two or more phases are not completely soluble in each other and do not form only one compound, the multi-phase material is formed from three or more constituents, the three or more constituents comprise $ZrO_2$, $YO_{1.5}$, and $TaO_{2.5}$, and the two or more phases consist essentially of (Y+Ta)-doped tetragonal zirconia plus orthorhombic phase $Zr_6Ta_2O_{17}$.

\* \* \* \* \*